(12) United States Patent
Nishimura (10) Patent No.: US 6,429,648 B1
(45) Date of Patent: Aug. 6, 2002

(54) CURRENT DETECTING DEVICE AND CURRENT DETECTING METHOD

(75) Inventor: Shinji Nishimura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 4 days.

(21) Appl. No.: 09/711,074

(22) Filed: Nov. 14, 2000

(30) Foreign Application Priority Data

May 26, 2000 (JP) ........................................ 2000-156611

(51) Int. Cl.⁷ ................................................. G01B 7/30
(52) U.S. Cl. ................................................. 324/207.25
(58) Field of Search ........................... 324/107, 207.13, 324/207.16, 207.21, 207.25; 318/375, 759, 799, 801, 808, 811, 807; 323/211, 218, 233

(56) References Cited

U.S. PATENT DOCUMENTS 5,568,042 A * 10/1996 Nyberg et al. ................. 323/11
6,014,006 A * 1/2000 Stuntz et al. ................. 318/804
6,262,555 B1 * 7/2001 Hammond et al. ......... 318/759

FOREIGN PATENT DOCUMENTS

| DE | 2360753 | 6/1974 |
|---|---|---|
| DE | 2704764 C2 | 11/1979 |
| DE | 19748550 A1 | 10/1998 |
| EP | 0597404 A2 | 5/1994 |
| JP | 7-336971 | 12/1995 |

OTHER PUBLICATIONS

Acarnley P.P., "Current Measurement In Three–Phase Brushless DC Drives", IEE Proceedings–B, Electric Power Applications, vol. 140, No. 1, Jan. 1993, pp. 71–79.

* cited by examiner

*Primary Examiner*—N. Le
*Assistant Examiner*—Etienne P LeRoux
(74) *Attorney, Agent, or Firm*—Sughrue Mion, PLLC (57) ABSTRACT

A current detecting device allows three-phase alternating currents of two different frequencies to be detected only by two current detecting sensors, thereby achieving reduced cost. The current detecting device includes a current detector for simultaneously detecting a plurality of three-phase alternating currents of different frequencies that are respectively output from two windings of a dynamo-electric machine having two windings wrapped around the same stator core, an estimator for obtaining estimated values of the respective currents; and a separation computing device for separating, by each frequency, currents detected by the current detecting device based on outputs of the estimating device.

16 Claims, 8 Drawing Sheets

CURRENT DETECTING DEVICE AND CURRENT DETECTING METHOD

BACKGROUND OF THE INVENTION

1. Field of the Invention

The present invention relates to a device of and a method for detecting three-phase alternating currents of two different frequencies, and more particularly, to a current detecting device and a current detecting method that permit a reduction in the number of current detecting sensors.

2. Description of the Related Art

Generally, in detection of a three-phase alternating current, once U- and V-phase currents are detected, a W-phase can be computed by —(U-phase+V-phase). Hence, a three-phase alternating current can be detected by using two current detecting sensors. Detecting three-phase alternating currents of two different frequencies has been requiring a total of four current detecting sensors to detect the U- and V-phase currents of each three-phase alternating current.

A current detecting device having a configuration mentioned above requires four expensive current detecting sensors, leading to increased cost.

SUMMARY OF THE INVENTION

The present invention has been made to solve the above problem, and it is an object of the present invention to provide a current detecting device and a current detecting method that allow three-phase alternating currents of two different frequencies to be detected only by two current detecting sensors, thereby achieving reduced cost.

To this end, according to one aspect of the present invention, there is provided a current detecting device, including:

current detecting means for simultaneously detecting a plurality of three-phase alternating currents of different frequencies that are respectively output from two windings of a dynamo-electric machine having two windings wrapped around the same stator core;

estimating means for obtaining estimated values of the respective currents; and separation computing means for separating, by each frequency, currents detected by the current detecting means based on outputs of the estimating means.

In a preferred form, the separation computing means includes:

two-phase alternating current converting means for converting a current detected by the current detecting means into a two-phase alternating current;

reverse rotation vector multiplying means for multiplying a value obtained by the two-phase alternating current converting means by a vector that rotates in a reverse direction at each frequency; and multiplied frequency difference vector subtracting means for subtracting an estimated value multiplied by a vector that rotates at a difference between frequencies from an output of the reverse rotation vector multiplying means.

In another preferred form, the current detecting means includes:

first current detecting means for simultaneously detecting a first phase current of a first alternating current and a first phase current of a second alternating current;

second current detecting means for simultaneously detecting a second phase current of the first alternating current and a second phase current of the second alternating current; and the separation computing means includes:

two-phase alternating current converting means for converting an output of the first current detecting means and an output of the second current detecting means into two-phase alternating currents;

first reverse rotation vector multiplying means for multiplying an output of the two-phase alternating current converting means by a unit vector rotating in a reverse direction at a frequency of the first alternating current;

second reverse rotation vector multiplying means for multiplying an output of the two-phase alternating current converting means by a unit vector rotating in a reverse direction at a frequency of the second alternating current;

first frequency difference vector multiplying means for multiplying an estimated value of the first alternating current by a unit vector rotating at (a frequency of the first alternating current minus a frequency of the second alternating current);

first vector subtracting means for subtracting an output of the first frequency difference vector multiplying means from an output of the second reverse rotation vector multiplying means;

second frequency difference vector multiplying means for multiplying an estimated value of the second alternating current by a unit vector rotating at (a frequency of the second alternating current minus a frequency of the first alternating current); and second vector subtracting means for subtracting an output of the second frequency difference vector multiplying means from an output of the first reverse rotation vector multiplying means.

In yet another preferred form, the current detecting means includes:

first current detecting means for simultaneously detecting a first phase current of a first alternating current and a first phase current of a second alternating current;

second current detecting means for simultaneously detecting a second phase current of the first alternating current and a second phase current of the second alternating current; and the separation computing means includes:

two-phase alternating current converting means for converting an output of the first current detecting means and an output of the second current detecting means into two-phase alternating currents;

first reverse rotation vector multiplying means for multiplying an output of the two-phase alternating current converting means by a unit vector rotating in a reverse direction at a frequency of the first alternating current;

second reverse rotation vector multiplying means for multiplying an output of the two-phase alternating current converting means by a unit vector rotating in a reverse direction at a frequency of the second alternating current;

first estimated value subtracting means for subtracting an estimated value of the first alternating current from an output of the first reverse rotation vector multiplying means;

first frequency difference vector multiplying means for multiplying an output of the first estimated value subtracting means by a unit vector rotating at (a frequency of the first alternating current minus a frequency of the second alternating current);

second estimated value subtracting means for subtracting an estimated value of the second alternating current from an output of the second reverse rotation vector multiplying means; and second frequency difference vector multiplying means for multiplying an output of the second estimated value subtracting means by a unit vector rotating at (a frequency of the second alternating current minus a frequency of the first alternating current).

The estimated value of the first alternating current and the estimated value of the second alternating current are current command values.

The estimated value of the first alternating current and the estimated value of the second alternating current are first-order lags of the outputs of the first vector subtracting means and the second vector subtracting means.

The estimated value of the first alternating current and the estimated value of the second alternating current are first-order lags of the outputs of the first frequency difference vector multiplying means and the second frequency difference vector multiplying means.

According to another aspect of the present invention, there is provided a current detecting device for detecting a first alternating current and a second alternating current having different frequencies that are respectively output from two windings of a dynamo-electric machine having two windings wrapped around the same stator core, including:

first current detecting means for simultaneously detecting a first phase current of a first alternating current and a first phase current of a second alternating current;

second current detecting means for simultaneously detecting a second phase current of the first alternating current and a second phase current of the second alternating current; and controlling means for setting a current of one winding to zero when detecting a current of the other winding.

According to still another aspect of the present invention, there is provided a current detecting method including:

a current detecting step for simultaneously detecting a plurality of three-phase alternating currents of different frequencies that are respectively output from two windings of a dynamo-electric machine having two windings wrapped around the same stator core;

an estimating step for obtaining estimated values of the respective currents; and a separation computing step for separating, by each frequency, currents detected by the current detecting step based on outputs of the estimating step.

In a preferred form, the separation computing step includes:

a two-phase alternating current converting step for converting a current detected by the current detecting step into a two-phase alternating current;

a reverse rotation vector multiplying step for multiplying a value obtained by the two-phase alternating current converting step by a vector that rotates in a reverse direction at each frequency; and a multiplied frequency difference vector subtracting step for subtracting an estimated value multiplied by a vector that rotates at a difference between frequencies from an output of the reverse rotation vector multiplying step.

In another preferred form, the current detecting step includes:

a first current detecting step for simultaneously detecting a first phase current of a first alternating current and a first phase current of a second alternating current;

a second current detecting step for simultaneously detecting a second phase current of the first alternating current and a second phase current of the second alternating current; and the separation computing step includes:

a two-phase alternating current converting step for converting an output of the first current detecting step and an output of the second current detecting step into two-phase alternating currents;

a first reverse rotation vector multiplying step for multiplying an output of the two-phase alternating current converting step by a unit vector rotating in a reverse direction at a frequency of the first alternating current;

a second reverse rotation vector multiplying step for multiplying an output of the two-phase alternating current converting step by a unit vector rotating in a reverse direction at a frequency of the second alternating current;

a first frequency difference vector multiplying step for multiplying an estimated value of the first alternating current by a unit vector rotating at (a frequency of the first alternating current minus a frequency of the second alternating current);

a first vector subtracting step for subtracting an output of the first frequency difference vector multiplying step from an output of the second reverse rotation vector multiplying step;

a second frequency difference vector multiplying step for multiplying an estimated value of the second alternating current by a unit vector rotating at (a frequency of the second alternating current minus a frequency of the first alternating current); and a second vector subtracting step for subtracting an output of the second frequency difference vector multiplying step from an output of the first reverse rotation vector multiplying step.

In yet another preferred form, the current detecting step includes:

a first current detecting step for simultaneously detecting a first phase current of a first alternating current and a first phase current of a second alternating current;

a second current detecting step for simultaneously detecting a second phase current of the first alternating current and a second phase current of the second alternating current; and the separation computing step includes:

a two-phase alternating current converting step for converting an output of the first current detecting step and an output of the second current detecting step into two-phase alternating currents;

a first reverse rotation vector multiplying step for multiplying an output of the two-phase alternating current converting step by a unit vector rotating in a reverse direction at a frequency of the first alternating current;

a second reverse rotation vector multiplying step for multiplying an output of the two-phase alternating current converting step by a unit vector rotating in a reverse direction at a frequency of the second alternating current;

a first estimated value subtracting step for subtracting an estimated value of the first alternating current from an output of the first reverse rotation vector multiplying step;

a first frequency difference vector multiplying step for multiplying an output of the first estimated value subtracting step by a unit vector rotating at (a frequency of the first alternating current minus a frequency of the second alternating current);

a second estimated value subtracting step for subtracting an estimated value of the second alternating current from an output of the second reverse rotation vector multiplying step; and a second frequency difference vector multiplying step for multiplying an output of the second estimated value subtracting step by a unit vector rotating at (a frequency of the second alternating current minus a frequency of the first alternating current).

The estimated value of the first alternating current and the estimated value of the second alternating current are current command values.

The estimated value of the first alternating current and the estimated value of the second alternating current are first-order lags of the outputs of the first vector subtracting step and the second vector subtracting step.

The estimated value of the first alternating current and the estimated value of the second alternating current are first-order lags of the outputs of the first frequency difference vector multiplying step and the second frequency difference vector multiplying step.

According to another aspect of the present invention, there is provided a current detecting method for detecting a first alternating current and a second alternating current having different frequencies that are respectively output from two windings of a dynamo-electric machine having two windings wrapped around the same stator core, including:

a first current detecting step for simultaneously detecting a first phase current of a first alternating current and a first phase current of a second alternating current;

a second current detecting step for simultaneously detecting a second phase current of the first alternating current and a second phase current of the second alternating current; and a controlling step for setting a current of one winding to zero when detecting a current of the other winding.

DESCRIPTION OF THE PREFERRED EMBODIMENTS

First Embodiment

Figure 1:
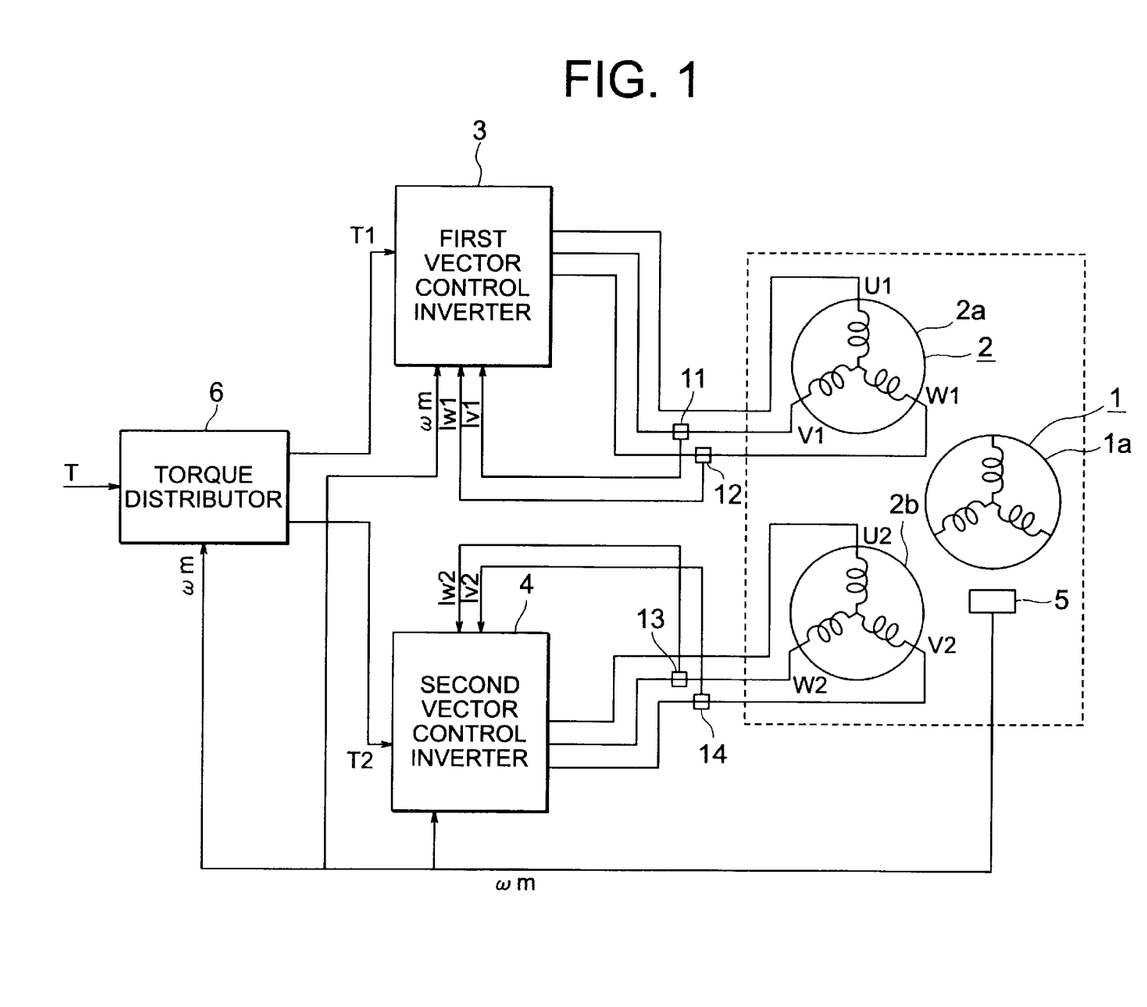
FIG. 1 is a block diagram of, for example, an induction motor with a changeable number of poles that has been previously posed.

FIG. 1 is a block diagram showing a block diagram of, for example, an induction motor with a changeable number of poles that has been previously proposed. FIG. 1 shows a rotor 1 having a squirrel-cage winding 1a, a stator 2 having a first winding 2a (U1, V1, and W1) wound with four poles and a second winding 2b (U2, V2, and W2) wound with eight poles, a first vector control inverter 3 for four-pole excitation connected to the first winding 2a, and a second vector control inverter 4 for eight-pole excitation connected to the second winding 2b.

A rotational speed sensor 5 serves as a rotational speed detecting means for detecting a rotational speed of the rotor 1. A torque command distributor 6 distributes a torque command based on a rotational speed.

A first current sensor 11 is connected to a V1 phase of the first winding 2a to detect the current of the V1 phase of the first winding 2a. A second current sensor 12 is connected to a W1 phase of the first winding 2a to detect the current of the W1 phase of the first winding 2a. Similarly, a third current sensor 13 is connected to a V2 phase of the second winding 2b to detect the current of the V2 phase of the second winding 2b. A fourth current sensor 14 is connected to a W2 phase of the second winding 2b to detect the current of the W2 phase of the second winding 2b.

A rotational speed ωm of a rotor 1 detected by the rotational speed sensor 5 is supplied to the first inverter 3, the second inverter 4, and the torque command distributor 6. A current Iw1 detected by the first current sensor 11 and a current Iv1 detected by the second current sensor 12 are supplied to the first inverter 3. Furthermore, a current Iw2 detected by the third current sensor 13 and a current Iv2 detected by the fourth current sensor 14 are supplied to the second inverter 4.

The torque command distributor 6 receives a torque command T, and distributes the received torque command T into the first torque command T1 to be output to the first inverter 3 and a second torque command T2 to be output to the second inverter 4.

To detect three-phase alternating currents in the motor having a configuration described above, once the currents of the V-phase and the W-phase are detected, the remaining U-phase can be computed by −(V-phase+W-phase), as has been described in the explanation of the prior art above. Thus, a total of four current sensors, the first through fourth current sensors 11 through 14, are required to detect three-phase alternating currents of two different frequencies output from the first winding 2a and the second winding 2b.

Figure 2:
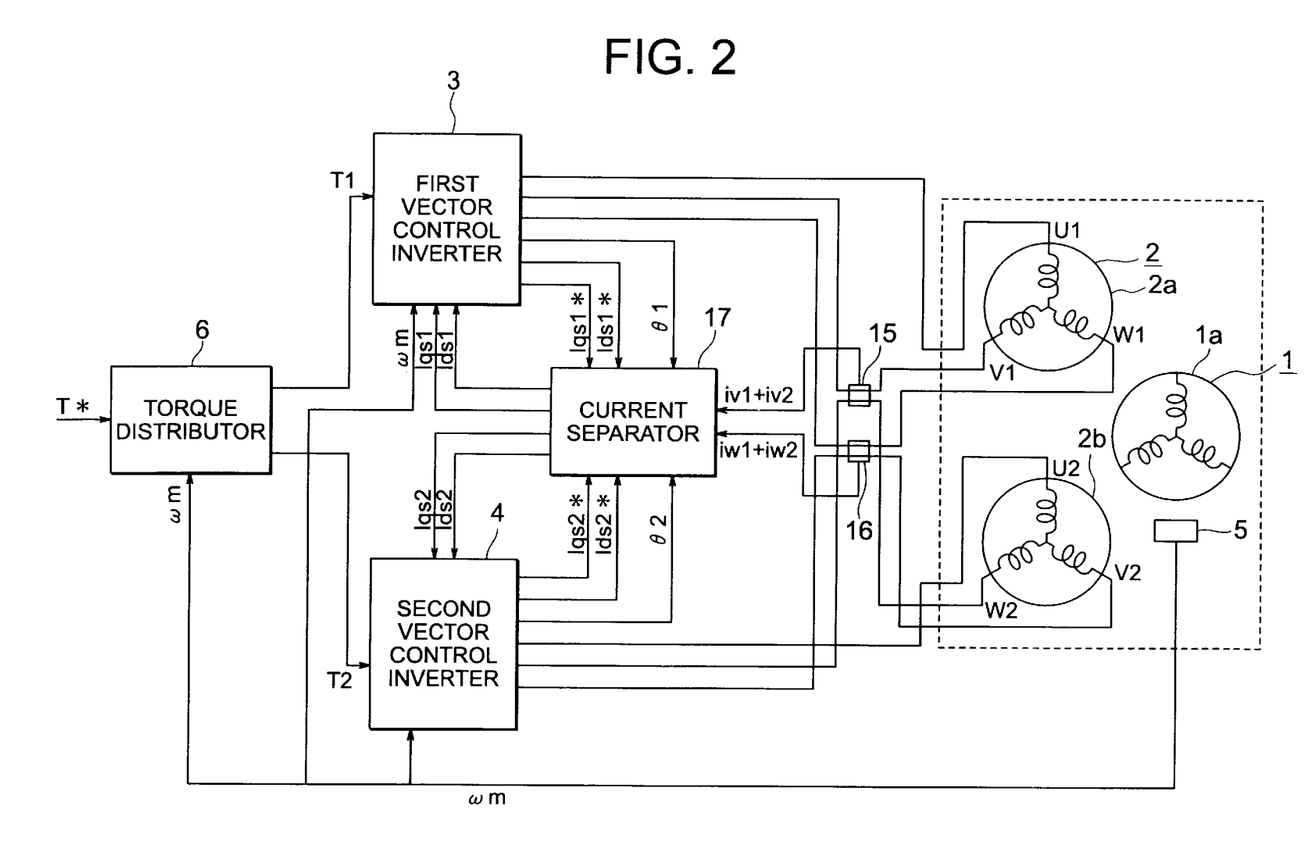
FIG. 2 is a block diagram illustrating a current detecting device and a current detecting method in accordance with the present invention.
Figure 3:
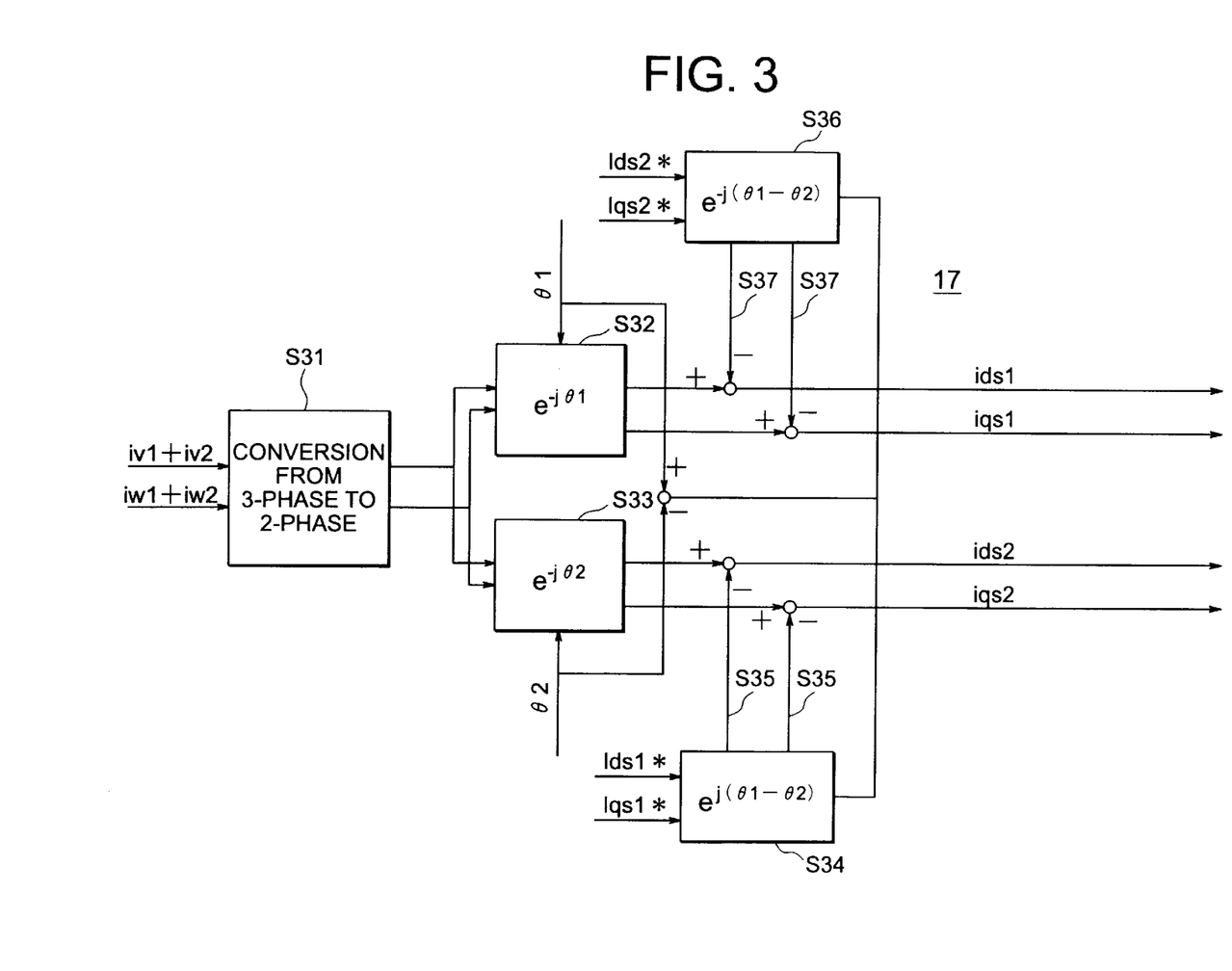
FIG. 3 is a diagram illustrating an operation of a current separator of FIG. 2.

FIG. 2 is a block diagram illustrating the current detecting device and the current detecting method in accordance with the present invention, and FIG. 3 is a diagram illustrating the operation of a current separator of FIG. 2. Referring to FIG. 2, a first current sensor 15 serves as a first current detecting means that is connected to the V1 phase of the first winding 2a and the V2 phase of the second winding 2b to simultaneously detect the currents of the V1 phase of the first winding 2a and the V2 phase of the second winding 2b (iV1+iV2). A second current sensor 16 serves as a second current detecting means that is connected to the W1 phase of the first winding 2a and the W2 phase of the second winding 2b to simultaneously detect the currents of the W1 phase of the first winding 2a and the W2 phase of the second winding 2b (iW1+iW2).

A current separator 17 serves as a separation computing means. The current separator 17 receives the current (iV1+iV2) detected by the first current sensor 15 and the current (iW1+iW2) detected by the second current sensor 16, and separates it into currents (direct current values) on a desired d-q axis, namely, a current Ids1 and a current Iqs1, and a current Ids2 and a current Iqs2, then outputs these currents to the first vector control inverter 3 and the second vector control inverter 4.

First, an outline of the operation of the current separator 17 will be described in conjunction with FIG. 3. The current separator 17 first carries out, in step S31, conversion from the three-phase to a two-phase on the foregoing current (iV1+iV2) received from the first winding 2a. Then, the obtained two-phase alternating current is multiplied, in step S32, by the frequency ω1 of the first winding 2a (in most cases of vector control of an induction machine, a vector control inverter includes frequency data) and a unit vector $e^{-j\theta 1}$ that rotates in a reverse direction; therefore, θ1=ω1t.

Thus, a current value on rotational coordinates that rotates at the first frequency ω1 can be obtained. This current value is a value obtained by adding a value, which is acquired by multiplying a current on a d-q axis rotating at a second frequency ω2 of a current value of the second winding 2b by a unit vector that rotates at (a second frequency θ2 minus the first frequency θ1), to a current (a direct current value) on a d-q axis of the first winding 2a; therefore, θ2=ω2t, θ1=ω1t, and so on.

Accordingly, subtracting the extra component mentioned above will provide the first currents, namely, Ids1 and Iqs1, on a first d-q axis. To subtract the extra component, a value obtained by multiplying estimated current values, namely, ids2* and iqs2*, by the above rotational component (a difference in frequency), namely, $(e^{-j(\theta 1-\theta 2)})$, is subtracted to obtain a desired current detection value (steps S36 and S37).

In the same manner, desired currents, namely, Ids2 and Iqs2, of the second winding 2b can be obtained (steps S33, S34, and S35).

A computation method of the current separator 17 will now be described in detail.

[Conversion from Three-phase into Two-phase]

A further detailed description will be given of the computation method of the current separator 17. In general, conversion of three-phase alternating currents, namely, $i_u$, $i_v$, and $i_w$ that are shifted 120 degrees in phase, into two-phase alternating currents, namely, $I_\alpha$ and $I_\beta$ that are shifted 90 degrees in phases on an α-axis and a β-axis, can be accomplished by using the following expression (1):

$$\begin{bmatrix} I_\alpha \\ I_\beta \end{bmatrix} = \sqrt{\frac{2}{3}} \begin{bmatrix} 1 & -\frac{1}{2} & -\frac{1}{2} \\ 0 & \frac{\sqrt{3}}{2} & -\frac{\sqrt{3}}{2} \end{bmatrix} \begin{bmatrix} i_u \\ i_v \\ i_w \end{bmatrix} \quad (1)$$

The following expression (2) can be derived from expression (1) above:

$$I_\alpha = \sqrt{\frac{2}{3}} \left( i_u - \frac{1}{2} i_v - \frac{1}{2} i_w \right) \quad (2)$$

$$I_\beta = \sqrt{\frac{2}{3}} \left( \frac{\sqrt{3}}{2} i_v - \frac{\sqrt{3}}{2} i_w \right)$$

At this time, $i_u = -i_v - i_w$, leading to the following expression:

$$I_\alpha = -\frac{\sqrt{6}}{2} (i_v + i_w) \quad (3)$$

$$I_\beta = \frac{\sqrt{2}}{2} (i_v - i_w)$$

Hence, determining $i_v$, and $i_w$ enables the conversion into the two-phase alternating current.

Expression (4) shown below will be derived by performing the same computation, using expression (3), on $v_1+v_2$ and $w_1+w_2$, which are resulting currents of two three-phase alternating currents of two different frequencies, $u_1$, $V_1$, $w_1$ and $u_2$, $v_2$, $W_2$, and which are detected by the current sensors 15 and 16:

$$I_\alpha = -\frac{\sqrt{6}}{2} (i_{v1} + i_{v2} + i_{w1} + i_{w2}) \quad (4)$$

$$I_\beta = \frac{\sqrt{2}}{2} (i_{v1} + i_{v2} - (i_{w1} + i_{w2}))$$

[Separation]

$I_\alpha$ and $I_\beta$ can be represented by complex numbers as shown below:

$$I = I_\alpha + jI_\beta = I_1 e^{j(\omega_1 t + \phi_1)} + I_2 e^{j(\omega_2 t + \phi_2)} \quad (5)$$

In expression (5), $e^{j(\omega_1 t + \phi_1)}$ represents a current that rotates at $\omega_1$ and has a phase of $\phi_1$. Sine the frequency of the current of each pole has been known, multiplying by $e^{-j\omega_1 t}$ and $e^{-j\omega_2 t}$ yields the following expression (6):

$$A = Ie^{-j\omega_1 t} = I_1 e^{j\phi_1} + I_2 e^{j\phi_2} e^{-j(\omega_1 - \omega_2)t}$$

$$B = Ie^{-j\omega_2 t} = I_2 e^{j\phi_2} + I_1 e^{j\phi_1} e^{j(\omega_1 - \omega_2)t} \quad (6)$$

The desired currents represented as shown below need to be determined:

$$I_1 e^{j\phi_1} = I_1 \cos\phi_1 + jI_1 \sin\phi_1 = I_{d1} + jI_{q1} \bigg\} \quad (7)$$

$$I_2 e^{j\phi_2} = I_2 \cos\phi_2 + jI_2 \sin\phi_2 = I_{d2} + jI_{q2}$$

Estimated values of the respective currents are represented as shown below:

Estimated value of $I_1 e^{j\phi_1}$ $(I_1 e^{j\phi_1})^*$

Estimated value of $I_2 e^{j\phi_2}$ $(I_2 e^{j\phi_2})^*$ (8)

Thus, the following expression (9) will be derived:

$$\{A - (I_1 e^{j\phi_1})^*\} \cdot e^{j(\omega_1 - \omega_2)t} = I_2 e^{j\phi_2} + \Delta_1 e^{j(\omega_1 - \omega_2)t}$$

$$\{B - (I_2 e^{j\phi_2})^*\} \cdot e^{-j(\omega_1 - \omega_2)t} = I_1 e^{j\phi_1} + \Delta_2 e^{-j(\omega_1 - \omega_2)t} \quad (9)$$

In the above expression, $\Delta_1$ and $\Delta_2$ denote errors of the estimated values; hence, carrying out control or setting the estimated values to eliminate the errors makes it possible to detect desired currents $I_1 e^{jf1}$ and $I_2 e^{jf2}$.

To implement the computation shown above in a device, actual calculation will be performed as described below.

First, the expression of the complex numbers will be shown by a real part and an imaginary part as indicated by expression (10) below:

$$\theta_1 = \omega_1 t, \; \theta_2 = \omega_2 t$$

$$I = I_1 e^{j(\theta_1 + \phi_1)} + I_2 e^{j(\theta_2 + \phi_2)} I_\alpha + jI_\beta \quad (10)$$

Real part $I_\alpha = I_1\cos(\theta_1 + \phi_1) + I_2\cos(\theta_2 + \phi_2)$

Imaginary part $I_\beta = I_1\sin(\theta_1 + \phi_1) + I_2\sin(\theta_2 + \phi_2)$ Multiplying the real part by $e^{-j\theta_1}$, which is a unit vector rotating in the reverse direction, yields the following:

$$A = Ie^{-j\theta_1} A_\alpha + jA_\beta$$

$$A_\alpha = I_\alpha \cos\theta_1 + I_\beta \sin\theta_1$$

$$A_\beta = I_\alpha \sin\theta_1 + I_\beta \cos\theta_1 \quad (11)$$

Multiplying the imaginary part by $e^{-j\theta_2}$, which is also a unit vector rotating in the reverse direction, yields the following:

$$B = Ie^{-j\theta_2} = B_\alpha + jB_\beta$$

$$B_\alpha = I_\alpha \cos\theta_2 + I_\beta \sin\theta_2$$

$$B_\beta = I_\alpha \sin\theta_2 + I_\beta \cos\theta_2 \quad (12)$$

Subtracting an estimated value $(I_1 e^{j\phi_1})^*$ from A (the estimated value $(I_1 e^{j\phi_1})^*$ corresponds to Iqs1* and Ids1* in FIG. 3) will be expressed as follows:

$$A - (I_1 e^{j\phi_1})^* = A_j - I^*_{1q} + j(A_\beta - I^*_{1d}) \quad (13)$$

$$(A - (I_1 e^{j\phi_1})^*)e^{j(\theta_1 - \theta_2)} = I_{2q} + jI_{2d}$$

$$I_{2q} = (A_\alpha - I^*_{1q})\cos(\theta_1 - \theta_2) - (A_\beta - I^*_{1d})\sin(\theta_1 - \theta_2)$$

$$I_{2d} = (A_\alpha - I^*_{1q})\sin(\theta_1 - \theta_2) + (A_\beta - I^*_{1d})\cos(\theta_1 - \theta_2)$$

Thus, desired currents $I_{2q}$ and $I_{2d}$ can be detected (the desired currents $I_{2q}$ and $I_{2d}$ correspond to Iqs2 and Ids2 in FIG. 3).

Similarly, for the imaginary part, subtracting an estimated value $(I_1 e^{j\phi_2})^*$ from B (the estimated value $(I_1 e^{j\phi_2})^*$ corresponds to Iqs2* and Ids2* in FIG. 3) will be expressed as follows:

$$(B - (I_2 e^{j\phi_2})^*)e^{-j(\theta_1 - \theta_2)} = I_{1q} + jI_{1d}$$

$$I_{1q} = (B_\alpha - I_{2q}^*)\cos(\theta_1 - \theta_2) + (B_\beta - I_{2d}^*)\sin(\theta_1 - \theta_2)$$

$$I_{1d} = -(B_\alpha - I_{2q}^*)\sin(\theta_1 - \theta_2) + (B_\beta - I_{2d}^*)\cos(\theta_1 - \theta_2) \quad (14)$$

Thus, desired currents $I_{1q}$ and $I_{1d}$ can be detected (the desired currents $I_{2q}$ and $I_{2d}$ correspond to Iqs2 and Ids2 in FIG. 3).

Based on the above computations, as shown in FIG. 3, the current detecting device 17 includes the following as the separation computing means/steps:

two-phase alternating current converting means/step (step S31) for converting an output (iv1+iv2) of the current sensor 15 and an output (iw1+iw2) of the current sensor 16 into two-phase alternating currents;

first reverse rotation vector multiplying means/step (step S32) for multiplying an output of the two-phase alternating current converting means/step by a unit vector $e^{-j\theta_1}$ rotating in the reverse direction at a frequency $\theta_1$ of a first alternating current;

second reverse rotation vector multiplying means/step (step S33) for multiplying an output of the two-phase alternating current converting means/step by a unit vector $e^{-j\theta_2}$ rotating in the reverse direction at a frequency $\theta_2$ of a second alternating current;

first frequency difference vector multiplying means/step (step S34) for multiplying an estimated value (Ids1*, Iqs1*) of the first alternating current by a unit vector $e^{j(\theta_1 - \theta_2)}$ rotating at (a frequency of the first alternating current minus a frequency of the second alternating current);

first vector subtracting means/step (step S35) for subtracting an output of the first frequency difference vector multiplying means/step from an output of the second reverse rotation vector multiplying means/step;

second frequency difference vector multiplying means/step (step S36) for multiplying an estimated value (Ids2*, Iqs2*) of the second alternating current by a unit vector $e^{-j(\theta_2 - \theta_1)}$ rotating at (a frequency of the second alternating current minus a frequency of the first alternating current); and second vector subtracting means/step (step S37) for subtracting an output of the second frequency difference vector multiplying means/step from an output of the first reverse rotation vector multiplying means/step;

to accomplish separation into desired currents (direct current values) on a d-q axis, namely, a current Iqs1 and a current Ids1, and a current Iqs2 and a current Ids2.

Second Embodiment

Figure 4:
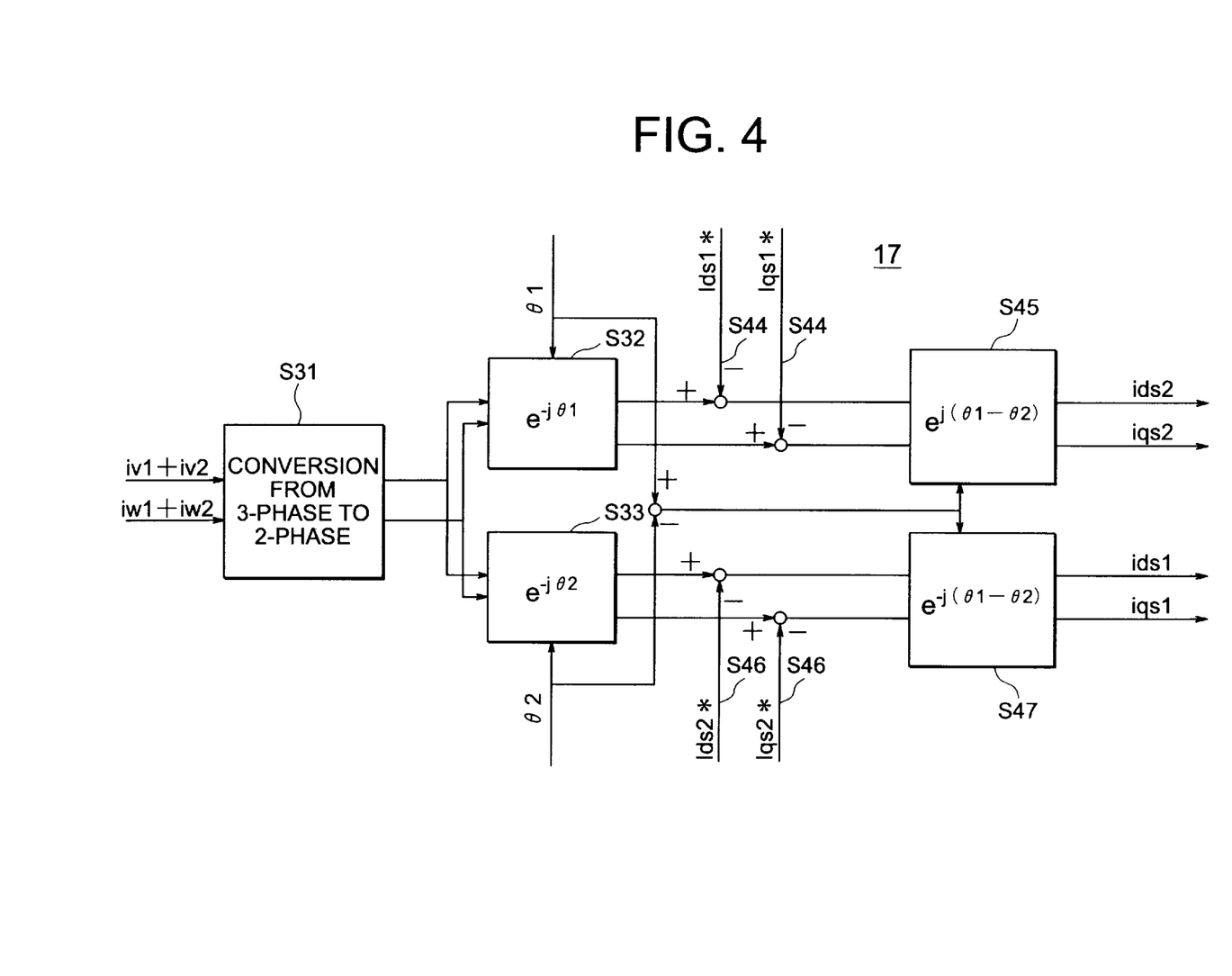
FIG. 4 is a diagram illustrating an operation of the current separator for explaining another example of the current detecting device and the current detecting method in accordance with the present invention.

FIG. 4 is a diagram illustrating an operation of the current separator for explaining another example of the current detecting device and the current detecting method in accordance with the present invention. The computing procedure implemented by the current separator of the first embodiment is as illustrated in FIG. 3; however, the computing procedure is not limited thereto.

Referring to FIG. 4, a current separator 17 according to this embodiment includes the following as the separation computing means/steps:

two-phase alternating current converting means/step (step S31) for converting an output (iv1+iv2) of the current sensor 15 and an output (iw1+iw2) of the current sensor 16 into two-phase alternating currents;

first reverse rotation vector multiplying means/step (step S32) for multiplying an output of the two-phase alternating current converting means/step by a unit vector $e^{-j\theta_1}$ rotating in the reverse direction at a frequency $\theta_1$ of a first alternating current;

second reverse rotation vector multiplying means/step (step S33) for multiplying an output of the two-phase alternating current converting means/step by a unit vector $e^{-j\theta_2}$ rotating in the reverse direction at a frequency $\theta_2$ of a second alternating current;

first estimated value subtracting means/step (step S44) for subtracting an estimated value (Ids1*, Iqs1*) of the first alternating current from an output of a first reverse rotation vector multiplying means/step;

first frequency difference vector multiplying means/step (step S45) for multiplying an output of the first estimated value subtracting means/step by a unit vector $e^{j(\theta_1 - \theta_2)}$ rotating at (a frequency of the first alternating current minus a frequency of the second alternating current);

second estimated value subtracting means/step (step S46) for subtracting an estimated value (Ids2*, Iqs2*) of the second alternating current from an output of a second reverse rotation vector multiplying means/step; and second frequency difference vector multiplying means/step (step S47) for multiplying an output of the second estimated value subtracting means/step by a unit vector $e^{-j(\theta_2 - \theta_1)}$ rotating at (a frequency of the second alternating current minus a frequency of the first alternating current);

to accomplish separation into desired currents (direct current values) on a d-q axis, namely, a current Iqs1 and a current Ids1, and a current Iqs2 and a current Ids2.

Third Embodiment

Figure 5:
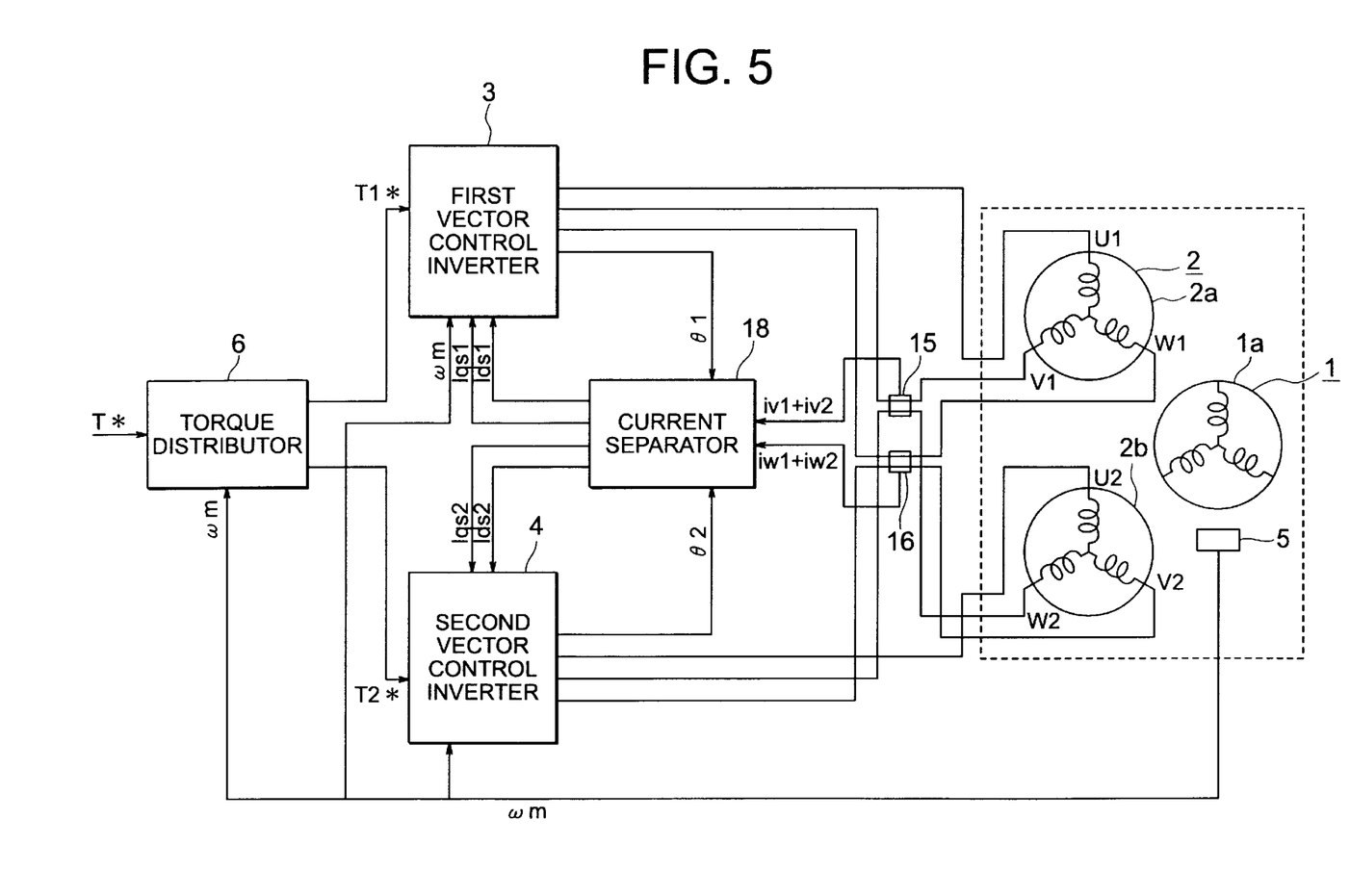
FIG. 5 is a block diagram illustrating still another example of the current detecting device and the current detecting method in accordance with the present invention.
Figure 6:
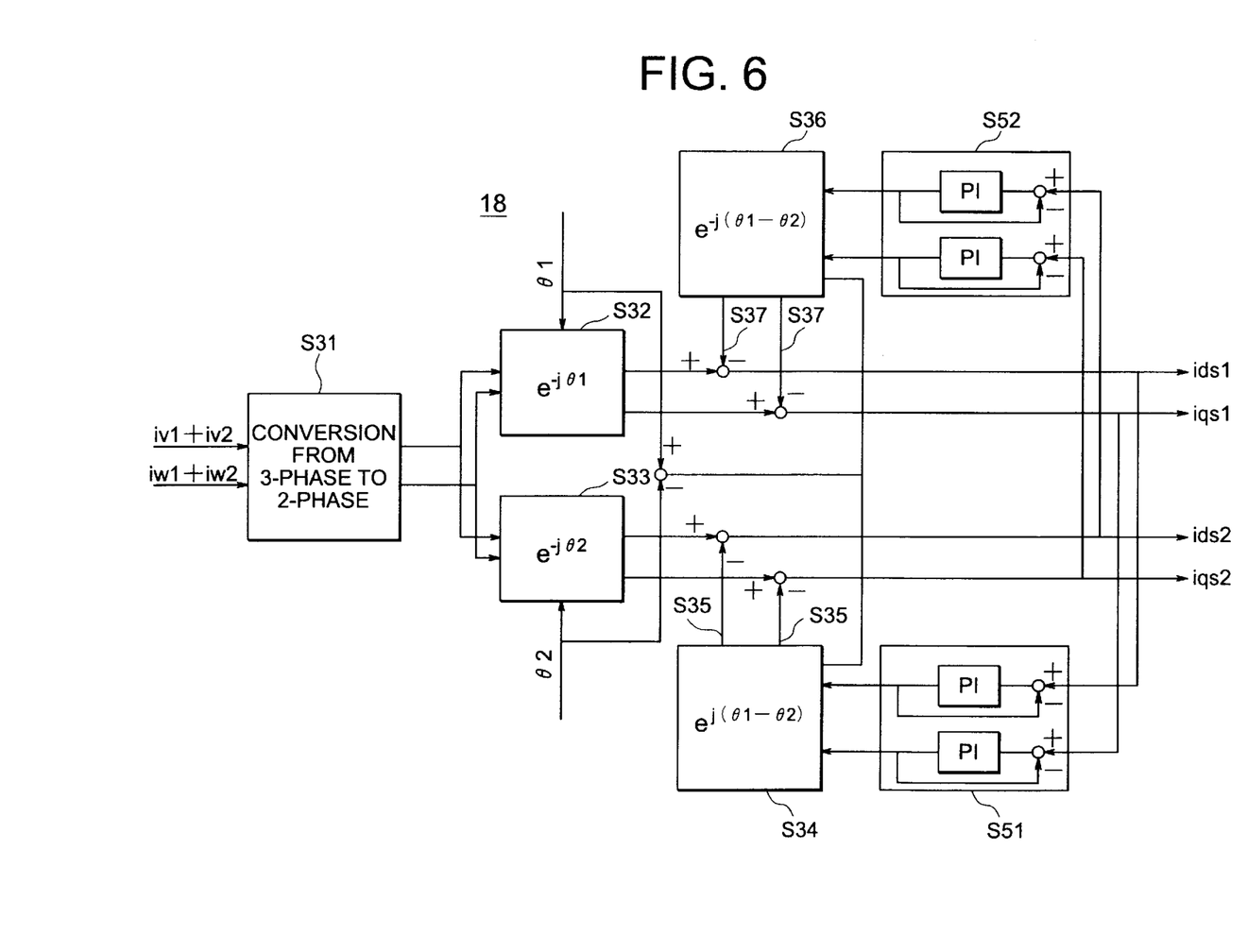
FIG. 6 is a diagram illustrating an operation of a current separator of FIG. 5.

FIG. 5 is a block diagram illustrating still another example of the current detecting device and the current detecting method in accordance with the present invention. FIG. 6 is a diagram illustrating an operation of a current separator of FIG. 5. In this embodiment, as shown in FIG. 5, a current separator 18 does not receive an estimated value of current.

The current separator 18 in this embodiment incorporates an estimating means (S51, S52) for currents (a d-q axis) as shown in FIG. 6.

A first estimating means (step S51) supplies a first-order lag that is an output of a first vector subtracting means (step S35) to a first frequency difference vector multiplying means (step S34) as an estimated current value.

Furthermore, a second estimating means (step S52) supplies a first-order lag that is an output of a second vector subtracting means (step S37) to a second frequency difference vector multiplying means (step S36) as an estimated current value.

The rest of the computing procedure is the same as that of the first embodiment.

The respective estimating means subtract a value, which has been obtained by integrating errors such that the error between a computed current and an estimated value becomes zero, from an estimated value to provide an updated estimated value, i.e., a first-order lag.

Fourth Embodiment

Figure 7:
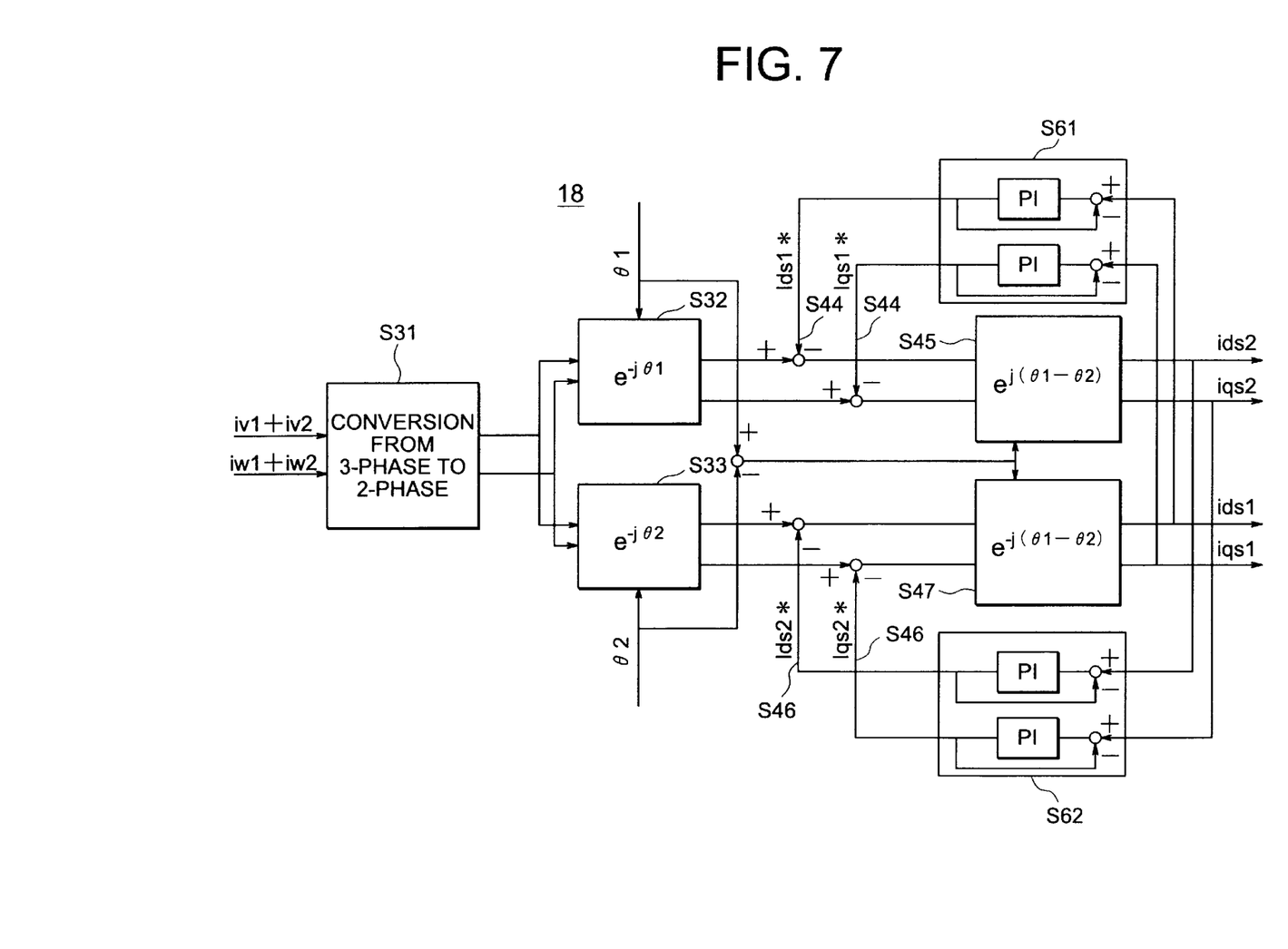
FIG. 7 is a diagram illustrating an operation of the current separator for explaining yet another example of the current detecting device and the current detecting method in accordance with the present invention.

FIG. 7 is a diagram illustrating an operation of the current separator for explaining yet another example of the current detecting device and the current detecting method in accordance with the present invention.

In this embodiment also, a current separator 18 does not receive an estimated value of current.

The current separator 18 in this embodiment incorporates an estimating means (S61, S62) for currents (a d-q axis) as shown in FIG. 7.

A first estimating means (step S61) supplies a first-order lag of an output of a first frequency difference vector multiplying means (step S45) to a first estimated value subtracting means (step S44). The first estimated value subtracting means (step S44) receives an output of the estimating means (step S61) as an estimated value (Ids1*, Iqs1*), and subtracts the foregoing received output from an output of a first reverse rotation vector multiplying means (step S32).

Furthermore, a second estimating means (step S62) supplies a first-order lag of an output of a second frequency difference vector multiplying means (step S47) to a second estimated value subtracting means (step S46). The second estimated value subtracting means (step S46) receives an output of the estimating means (step S62) as an estimated value (Ids2*, Iqs2*), and subtracts the foregoing received output from an output of a second reverse rotation vector multiplying means (step S33).

The rest of the computing procedure is the same as that of the second embodiment.

The respective estimating means subtract a value, which has been obtained by integrating errors such that the error between a computed current and an estimated value becomes zero, from an estimated value to provide an updated estimated value, i.e., a first-order lag.

Fifth Embodiment

In the first through fourth embodiments described above, the obtained desired currents (Ids1, Iqs1, Ids2, and Iqs2) are currents on the d-q axis. However, multiplying these currents by unit vectors rotating at frequencies $\theta1$ and $\theta2$ makes it possible to obtain currents observed on stator coordinates.

In vector control, determining currents $I_{1d}$, $I_{1q}$ and $I_{2d}$, $I_{2q}$ represented on respective rotation coordinates makes it possible to obtain desired currents. Representing currents on the stator coordinates will require the following currents $I_{1\alpha}$, $I_{1\beta}$ and $I_{2\alpha}$, $I_{2\beta}$ obtained by multiplying using the unit vectors rotating at respective frequencies.

$$I_{1\alpha}=I_{1q} \cos \theta_1 - I_{1d} \sin \theta_1$$

$$I_{1\beta}=I_{1q} \sin \theta_1 + I_{1d} \cos \theta_1$$

$$I_{2\alpha}=I_{2q} \cos \theta_2 - I_{2d} \sin \theta_2$$

$$I_{2\beta}=I_{2q} \sin \theta_2 + I_{2d} \cos \theta_2 \quad (15)$$

Sixth Embodiment

In the above fifth embodiment, the obtained currents (Ids1, Iqs1, Ids2, and Iqs2) on the d-q axis have been multiplied by the unit vectors to determine the currents observed on the stator coordinates. Converting the currents on the stator coordinates in the opposite direction to that of the first embodiment, namely, from the two-phase into the three-phase, makes it possible to obtain a line current instantaneous value of each coil.

Seventh Embodiment

Figure 8:
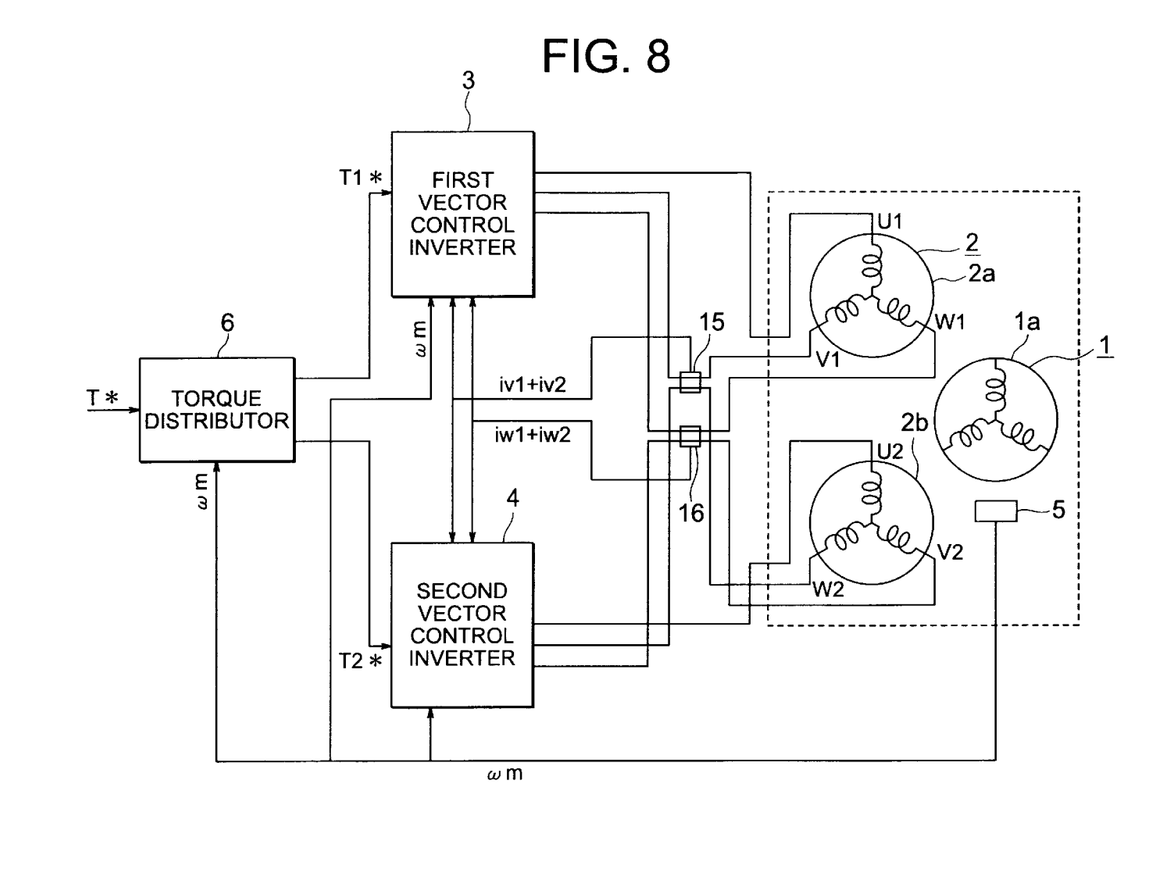
FIG. 8 is a block diagram illustrating a further example of the current detecting method in accordance with the present invention.

FIG. 8 is a block diagram illustrating a further example of the current detecting method in accordance with the present invention.

Referring to FIG. 8, a first current sensor 15 serving as a first current detecting means is connected to a V1 phase of the first winding 2a and a V2 phase of the second winding 2b to simultaneously detect the currents of the V1 phase of the first winding 2a and the V2 phase of the second winding 2b (iV1+iV2), and outputs the detection result to a first vector control inverter 3.

A second current sensor 16 serving as a second current detecting means is connected to a W1 phase of the first winding 2a and a W2 phase of the second winding 2b to simultaneously detect the currents of the W1 phase of the first winding 2a and the W2 phase of the second winding 2b (iW1+iW2), and outputs the detection result to the first vector control inverter 3 and a second vector control inverter 4.

Both the vector control inverters 3 and 4 in this embodiment are adapted to set a current to be output to one winding to zero beforehand when a current of the other winding is detected. Adopting this control method enables desired currents to be detected using only two current sensors.

Thus, the current detecting device according to the present invention includes: current detecting means for simultaneously detecting a plurality of three-phase alternating currents of different frequencies that are respectively output from two windings of a dynamo-electric machine having two windings wrapped around the same stator core; estimating means for obtaining estimated values of the respective currents; and separation computing means for separating, by each frequency, currents detected by the current detecting means based on outputs of the estimating means. This arrangement enables a reduced number of current detecting means and lower cost to be achieved.

The separation computing means includes: two-phase alternating current converting means for converting a current detected by the current detecting means into a two-phase alternating current; reverse rotation vector multiplying means for multiplying a value obtained by the two-phase alternating current converting means by a vector that rotates in a reverse direction at each frequency; and multiplied frequency difference vector subtracting means for subtracting an estimated value multiplied by a vector that rotates at a difference between frequencies from an output of the reverse rotation vector multiplying means. With this arrangement, the number of the current detecting means and the cost can be reduced by using a simple configuration.

Furthermore, the current detecting means includes: first current detecting means for simultaneously detecting a first phase current of a first alternating current and a first phase current of a second alternating current; second current detecting means for simultaneously detecting a second phase current of the first alternating current and a second phase current of the second alternating current; and the separation computing means includes: two-phase alternating current converting means for converting an output of the first current detecting means and an output of the second current detecting means into two-phase alternating currents; first reverse rotation vector multiplying means for multiplying an output of the two-phase alternating current converting means by a unit vector rotating in a reverse direction at a frequency of the first alternating current; second reverse rotation vector multiplying means for multiplying an output of the two-phase alternating current converting means by a unit vector rotating in a reverse direction at a frequency of the second alternating current; first frequency difference vector multiplying means for multiplying an estimated value of the first alternating current by a unit vector rotating at (a frequency of the first alternating current minus a frequency of the second alternating current); first vector subtracting means for subtracting an output of the first frequency difference vector multiplying means from an output of the second reverse rotation vector multiplying means; second frequency difference vector multiplying means for multiplying an estimated value of the second alternating current by a unit vector rotating at (a frequency of the second alternating current minus a frequency of the first alternating current); and second vector subtracting means for subtracting an output of the second frequency difference vector multiplying means from an output of the first reverse rotation vector multiplying means. With this arrangement, the number of the current detecting means and the cost can be reduced, and desired currents can be accurately detected.

The current detecting means includes: first current detecting means for simultaneously detecting a first phase current of a first alternating current and a first phase current of a second alternating current; second current detecting means for simultaneously detecting a second phase current of the first alternating current and a second phase current of the second alternating current; and the separation computing means includes: two-phase alternating current converting means for converting an output of the first current detecting means and an output of the second current detecting means into two-phase alternating currents; first reverse rotation vector multiplying means for multiplying an output of the two-phase alternating current converting means by a unit vector rotating in a reverse direction at a frequency of the first alternating current; second reverse rotation vector multiplying means for multiplying an output of the two-phase alternating current converting means by a unit vector rotating in a reverse direction at a frequency of the second alternating current; first estimated value subtracting means for subtracting an estimated value of the first alternating current from an output of the first reverse rotation vector multiplying means; first frequency difference vector multiplying means for multiplying an output of the first estimated value subtracting means by a unit vector rotating at (a frequency of the first alternating current minus a frequency of the second alternating current); second estimated value subtracting means for subtracting an estimated value of the second alternating current from an output of the second reverse rotation vector multiplying means; and second frequency difference vector multiplying means for multiplying an output of the second estimated value subtracting means by a unit vector rotating at (a frequency of the second alternating current minus a frequency of the first alternating current). With this arrangement, the number of the current detecting means and the cost can be reduced, and desired currents can be accurately detected.

The estimated value of the first alternating current and the estimated value of the second alternating current are current command values. This permits quicker responses in current detection.

The estimated value of the first alternating current and the estimated value of the second alternating current are first-order lags of the outputs of the first vector subtracting means and the second vector subtracting means. This makes it possible to detect desired currents further accurately.

Furthermore, the estimated value of the first alternating current and the estimated value of the second alternating current are first-order lags of the outputs of the first frequency difference vector multiplying means and the second frequency difference vector multiplying means. This makes it possible to detect desired currents further accurately.

Moreover, the inventive current detecting device for detecting a first alternating current and a second alternating current having different frequencies that are respectively output from two windings of a dynamo-electric machine having two windings wrapped around the same stator core includes: first current detecting means for simultaneously detecting a first phase current of a first alternating current and a first phase current of a second alternating current; second current detecting means for simultaneously detecting a second phase current of the first alternating current and a second phase current of the second alternating current; and controlling means for setting a current of one winding to zero when detecting a current of the other winding. This arrangement makes it possible to reduce the number of current detecting means, simplify the configuration, and reduce cost.

The inventive current detecting method includes: a current detecting step for simultaneously detecting a plurality of three-phase alternating currents of different frequencies that are respectively output from two windings of a dynamo-electric machine having two windings wrapped around the same stator core; an estimating step for obtaining estimated values of the respective currents; and a separation computing step for separating, by each frequency, currents detected by the current detecting step based on outputs of the estimating step. This arrangement enables the number of the current detecting means and cost to be reduced.

The separation computing step includes: a two-phase alternating current converting step for converting a current detected by the current detecting step into a two-phase alternating current; a reverse rotation vector multiplying step for multiplying a value obtained by the two-phase alternating current converting step by a vector that rotates in a reverse direction at each frequency; and a multiplied frequency difference vector subtracting step for subtracting an estimated value multiplied by a vector that rotates at a difference between frequencies from an output of the reverse rotation vector multiplying step. With this arrangement, the number of the current detecting means and cost to be reduced using a simple method.

The current detecting step includes: a first current detecting step for simultaneously detecting a first phase current of a first alternating current and a first phase current of a second alternating current; a second current detecting step for simultaneously detecting a second phase current of the first alternating current and a second phase current of the second alternating current; and the separating and computing step includes: a two-phase alternating current converting step for converting an output of the first current detecting step and an output of the second current detecting step into two-phase alternating currents; a first reverse rotation vector multiplying step for multiplying an output of the two-phase alternating current converting step by a unit vector rotating in a reverse direction at a frequency of the first alternating current; a second reverse rotation vector multiplying step for multiplying an output of the two-phase alternating current converting step by a unit vector rotating in a reverse direction at a frequency of the second alternating current; a first frequency difference vector multiplying step for multiplying an estimated value of the first alternating current by a unit vector rotating at (a frequency of the first alternating current minus a frequency of the second alternating current); a first vector subtracting step for subtracting an output of the first frequency difference vector multiplying step from an output of the second reverse rotation vector multiplying step; a second frequency difference vector multiplying step for multiplying an estimated value of the second alternating current by a unit vector rotating at (a frequency of the second alternating current minus a frequency of the first alternating current); and a second vector subtracting step for subtracting an output of the second frequency difference vector multiplying step from an output of the first reverse rotation vector multiplying step. With this arrangement, the number of the current detecting means and cost to be reduced, and desired currents can be accurately detected.

The current detecting step includes: a first current detecting step for simultaneously detecting a first phase current of a first alternating current and a first phase current of a second alternating current; a second current detecting step for simultaneously detecting a second phase current of the first alternating current and a second phase current of the second alternating current; and the separating and computing step includes: a two-phase alternating current converting step for converting an output of the first current detecting step and an output of the second current detecting step into two-phase alternating currents; a first reverse rotation vector multiplying step for multiplying an output of the two-phase alternating current converting step by a unit vector rotating in a reverse direction at a frequency of the first alternating current; a second reverse rotation vector multiplying step for multiplying an output of the two-phase alternating current converting step by a unit vector rotating in a reverse direction at a frequency of the second alternating current; a first estimated value subtracting step for subtracting an estimated value of the first alternating current from an output of the first reverse rotation vector multiplying step; a first frequency difference vector multiplying step for multiplying an output of the first estimated value subtracting step by a unit vector rotating at (a frequency of the first alternating current minus a frequency of the second alternating current); a second estimated value subtracting step for subtracting an estimated value of the second alternating current from an output of the second reverse rotation vector multiplying step; and a second frequency difference vector multiplying step for multiplying an output of the second estimated value subtracting step by a unit vector rotating at (a frequency of the second alternating current minus a frequency of the first alternating current). With this arrangement, the number of the current detecting means and cost to be reduced, and desired currents can be accurately detected.

The estimated value of the first alternating current and the estimated value of the second alternating current are current command values. This arrangement permits quicker responses in current detection.

The estimated value of the first alternating current and the estimated value of the second alternating current are first-order lags of the outputs of the first vector subtracting step and the second vector subtracting step. with this arrangement, desired currents can be detected further accurately.

The estimated value of the first alternating current and the estimated value of the second alternating current are first-order lags of the outputs of the first frequency difference vector multiplying step and the second frequency difference vector multiplying step. With this arrangement, desired currents can be detected further accurately.

The inventive current detecting method for detecting a first alternating current and a second alternating current having different frequencies that are respectively output from two windings of a dynamo-electric machine having two windings wrapped around the same stator core includes: a first current detecting step for simultaneously detecting a first phase current of a first alternating current and a first phase current of a second alternating current; a second current detecting step for simultaneously detecting a second phase current of the first alternating current and a second phase current of the second alternating current; and a controlling step for setting a current of one winding to zero when detecting a current of the other winding. This arrangement permits the number of the current detecting means to be reduced, a simpler procedure to be achieved, and cost to be reduced.

What is claimed is:
1. A current detecting device comprising:
current detecting means for simultaneously detecting a plurality of three-phase alternating currents of different frequencies that are respectively output from two windings of a dynamo-electric machine having two windings wrapped around the same stator core;
estimating means for obtaining estimated values of the respective currents; and
separation computing means for separating, by each frequency, currents detected by the current detecting means based on outputs of the estimating means.
2. A current detecting device according to claim 1, wherein the separation computing means comprises:
two-phase alternating current converting means for converting a current detected by the current detecting means into a two-phase alternating current;
reverse rotation vector multiplying means for multiplying a value obtained by the two-phase alternating current converting means by a vector that rotates in a reverse direction at each frequency; and multiplied frequency difference vector subtracting means for subtracting an estimated value multiplied by a vector that rotates at a difference between frequencies from an output of the reverse rotation vector multiplying means.

3. A current detecting device according to claim 1, wherein the current detecting means comprises:
- first current detecting means for simultaneously detecting a first phase current of a first alternating current and a first phase current of a second alternating current;
- second current detecting means for simultaneously detecting a second phase current of the first alternating current and a second phase current of the second alternating current; and the separation computing means comprises:
- two-phase alternating current converting means for converting an output of the first current detecting means and an output of the second current detecting means into two-phase alternating currents;
- first reverse rotation vector multiplying means for multiplying an output of the two-phase alternating current converting means by a unit vector rotating in a reverse direction at a frequency of the first alternating current;
- second reverse rotation vector multiplying means for multiplying an output of the two-phase alternating current converting means by a unit vector rotating in a reverse direction at a frequency of the second alternating current;
- first frequency difference vector multiplying means for multiplying an estimated value of the first alternating current by a unit vector rotating at (a frequency of the first alternating current minus a frequency of the second alternating current);
- first vector subtracting means for subtracting an output of the first frequency difference vector multiplying means from an output of the second reverse rotation vector multiplying means;
- second frequency difference vector multiplying means for multiplying an estimated value of the second alternating current by a unit vector rotating at (a frequency of the second alternating current minus a frequency of the first alternating current); and
- second vector subtracting means for subtracting an output of the second frequency difference vector multiplying means from an output of the first reverse rotation vector multiplying means.

4. A current detecting device according to claim 1, wherein the current detecting means comprises:
- first current detecting means for simultaneously detecting a first phase current of a first alternating current and a first phase current of a second alternating current;
- second current detecting means for simultaneously detecting a second phase current of the first alternating current and a second phase current of the second alternating current; and the separation computing means comprises:
- two-phase alternating current converting means for converting an output of the first current detecting means and an output of the second current detecting means into two-phase alternating currents;
- first reverse rotation vector multiplying means for multiplying an output of the two-phase alternating current converting means by a unit vector rotating in a reverse direction at a frequency of the first alternating current;
- second reverse rotation vector multiplying means for multiplying an output of the two-phase alternating current converting means by a unit vector rotating in a reverse direction at a frequency of the second alternating current;
- first estimated value subtracting means for subtracting an estimated value of the first alternating current from an output of the first reverse rotation vector multiplying means;
- first frequency difference vector multiplying means for multiplying an output of the first estimated value subtracting means by a unit vector rotating at (a frequency of the first alternating current minus a frequency of the second alternating current);
- second estimated value subtracting means for subtracting an estimated value of the second alternating current from an output of the second reverse rotation vector multiplying means; and
- second frequency difference vector multiplying means for multiplying an output of the second estimated value subtracting means by a unit vector rotating at (a frequency of the second alternating current minus a frequency of the first alternating current).

5. A current detecting device according to claim 2, wherein
the estimated value of the first alternating current and the estimated value of the second alternating current are current command values.

6. A current detecting device according to claim 3, wherein
the estimated value of the first alternating current and the estimated value of the second alternating current are first-order lags of the outputs of the first vector subtracting means and the second vector subtracting means.

7. A current detecting device according to claim 4, wherein
the estimated value of the first alternating current and the estimated value of the second alternating current are first-order lags of the outputs of the first frequency difference vector multiplying means and the second frequency difference vector multiplying means.

8. A current detecting device for detecting a first alternating current and a second alternating current having different frequencies that are respectively output from two windings of a dynamo-electric machine having two windings wrapped around the same stator core, comprising:
- first current detecting means for simultaneously detecting a first phase current of a first alternating current and a first phase current of a second alternating current;
- second current detecting means for simultaneously detecting a second phase current of the first alternating current and a second phase current of the second alternating current; and
- controlling means for setting a current of one winding to zero when detecting a current of the other winding.

9. A current detecting method comprising:
- a current detecting step for simultaneously detecting a plurality of three-phase alternating currents of different frequencies that are respectively output from two windings of a dynamo-electric machine having two windings wrapped around the same stator core;
- an estimating step for obtaining estimated values of the respective currents; and
- a separation computing step for separating, by each frequency, currents detected by the current detecting step based on outputs of the estimating step.

10. A current detecting method according to claim 9, wherein
the separation computing step comprises:

a two-phase alternating current converting step for converting a current detected by the current detecting step into a two-phase alternating current;

a reverse rotation vector multiplying step for multiplying a value obtained by the two-phase alternating current converting step by a vector that rotates in a reverse direction at each frequency; and a multiplied frequency difference vector subtracting step for subtracting an estimated value multiplied by a vector that rotates at a difference between frequencies from an output of the reverse rotation vector multiplying step.

11. A current detecting method according to claim 9, wherein the current detecting step comprises:

a first current detecting step for simultaneously detecting a first phase current of a first alternating current and a first phase current of a second alternating current;

a second current detecting step for simultaneously detecting a second phase current of the first alternating current and a second phase current of the second alternating current; and the separation computing step comprises:

a two-phase alternating current converting step for converting an output of the first current detecting step and an output of the second current detecting step into two-phase alternating currents;

a first reverse rotation vector multiplying step for multiplying an output of the two-phase alternating current converting step by a unit vector rotating in a reverse direction at a frequency of the first alternating current;

a second reverse rotation vector multiplying step for multiplying an output of the two-phase alternating current converting step by a unit vector rotating in a reverse direction at a frequency of the second alternating current;

a first frequency difference vector multiplying step for multiplying an estimated value of the first alternating current by a unit vector rotating at (a frequency of the first alternating current minus a frequency of the second alternating current);

a first vector subtracting step for subtracting an output of the first frequency difference vector multiplying step from an output of the second reverse rotation vector multiplying step;

a second frequency difference vector multiplying step for multiplying an estimated value of the second alternating current by a unit vector rotating at (a frequency of the second alternating current minus a frequency of the first alternating current); and a second vector subtracting step for subtracting an output of the second frequency difference vector multiplying step from an output of the first reverse rotation vector multiplying step.

12. A current detecting method according to claim 9, wherein the current detecting step comprises:

a first current detecting step for simultaneously detecting a first phase current of a first alternating current and a first phase current of a second alternating current;

a second current detecting step for simultaneously detecting a second phase current of the first alternating current and a second phase current of the second alternating current; and the separation computing step comprises:

a two-phase alternating current converting step for converting an output of the first current detecting step and an output of the second current detecting step into two-phase alternating currents;

a first reverse rotation vector multiplying step for multiplying an output of the two-phase alternating current converting step by a unit vector rotating in a reverse direction at a frequency of the first alternating current;

a second reverse rotation vector multiplying step for multiplying an output of the two-phase alternating current converting step by a unit vector rotating in a reverse direction at a frequency of the second alternating current;

a first estimated value subtracting step for subtracting an estimated value of the first alternating current from an output of the first reverse rotation vector multiplying step;

a first frequency difference vector multiplying step for multiplying an output of the first estimated value subtracting step by a unit vector rotating at (a frequency of the first alternating current minus a frequency of the second alternating current);

a second estimated value subtracting step for subtracting an estimated value of the second alternating current from an output of the second reverse rotation vector multiplying step; and a second frequency difference vector multiplying step for multiplying an output of the second estimated value subtracting step by a unit vector rotating at (a frequency of the second alternating current minus a frequency of the first alternating current).

13. A current detecting method according to claim 10, wherein the estimated value of the first alternating current and the estimated value of the second alternating current are current command values.

14. A current detecting method according to claim 11, wherein the estimated value of the first alternating current and the estimated value of the second alternating current are first-order lags of the outputs of the first vector subtracting step and the second vector subtracting step.

15. A current detecting method according to claim 12, wherein the estimated value of the first alternating current and the estimated value of the second alternating current are first-order lags of the outputs of the first frequency difference vector multiplying step and the second frequency difference vector multiplying step.

16. A current detecting method for detecting a first alternating current and a second alternating current having different frequencies that are respectively output from two windings of a dynamo-electric machine having two windings wrapped around the same stator core, comprising:

a first current detecting step for simultaneously detecting a first phase current of a first alternating current and a first phase current of a second alternating current;

a second current detecting step for simultaneously detecting a second phase current of the first alternating current and a second phase current of the second alternating current; and a controlling step for setting a current of one winding to zero when detecting a current of the other winding.

* * * * *